United States Patent [19]

Van Den Enden

[11] Patent Number: 5,835,296
[45] Date of Patent: Nov. 10, 1998

[54] APPARATUS FOR REPRODUCING A DIGITAL INFORMATION SIGNAL FROM A RECORD CARRIER AND COUNTING THE NUMBER OF BITS BETWEEN TWO SYNC PATTERNS

[75] Inventor: Gijsbert J. Van Den Enden, Eindhoven, Netherlands

[73] Assignee: U.S. Philips Corporation, New York, N.Y.

[21] Appl. No.: 815,236

[22] Filed: Mar. 12, 1997

[30] Foreign Application Priority Data

Apr. 26, 1996 [EP] European Pat. Off. .............. 96201143

[51] Int. Cl.⁶ .................................................. G11B 5/09
[52] U.S. Cl. ................................ 360/51; 360/32; 360/40; 360/48
[58] Field of Search .................................. 360/51, 40, 39, 360/48, 32; 375/326, 327, 340, 368; 377/28, 50

[56] References Cited

U.S. PATENT DOCUMENTS

| | | | |
|---|---|---|---|
| 5,245,483 | 9/1993 | Van Gestel ............................... | 360/40 |
| 5,488,516 | 1/1996 | Kalfs et al. ............................... | 360/51 |
| 5,526,200 | 6/1996 | Yada ........................................ | 360/51 |
| 5,663,942 | 9/1997 | Ishibashi et al. ......................... | 369/47 |
| 5,666,341 | 9/1997 | Horibe et al. ............................. | 360/51 |

*Primary Examiner*—Aristotelis M. Psitos
*Assistant Examiner*—Regina Y. Neal
*Attorney, Agent, or Firm*—Michael E. Belk

[57] ABSTRACT

An apparatus for reproducing a digital information signal from a record carrier includes a read unit for reading a signal from a track on the record carrier, a bit detection unit for deriving the digital information signal from the signal read from the track in response to a clock signal and a phase locked loop for deriving the clock signal from the signal read from the track. The phase locked loop includes a phase comparator for deriving a phase error signal and a voltage controlled oscillator for deriving the clock signal. The apparatus further includes a sync pattern detector for detecting sync patterns occurring in the digital information signal and a counter for counting the number of bits occurring between two sync patterns in the digital information signal. If the number of bits counted between the two sync patterns exceeds a predetermined value (THR) by at least one, at least one additional bit is inserted into the digital information signal (an insertion error) and this at least one additional bit should be deleted from the digital information in order to keep the apparatus in synchronisation. When the predetermined number exceeds the number of bits counted by at least one, at least one bit was deleted from the digital information signal (a deletion error), so that at least one bit should be added in order to keep the apparatus in synchronization.

5 Claims, 2 Drawing Sheets

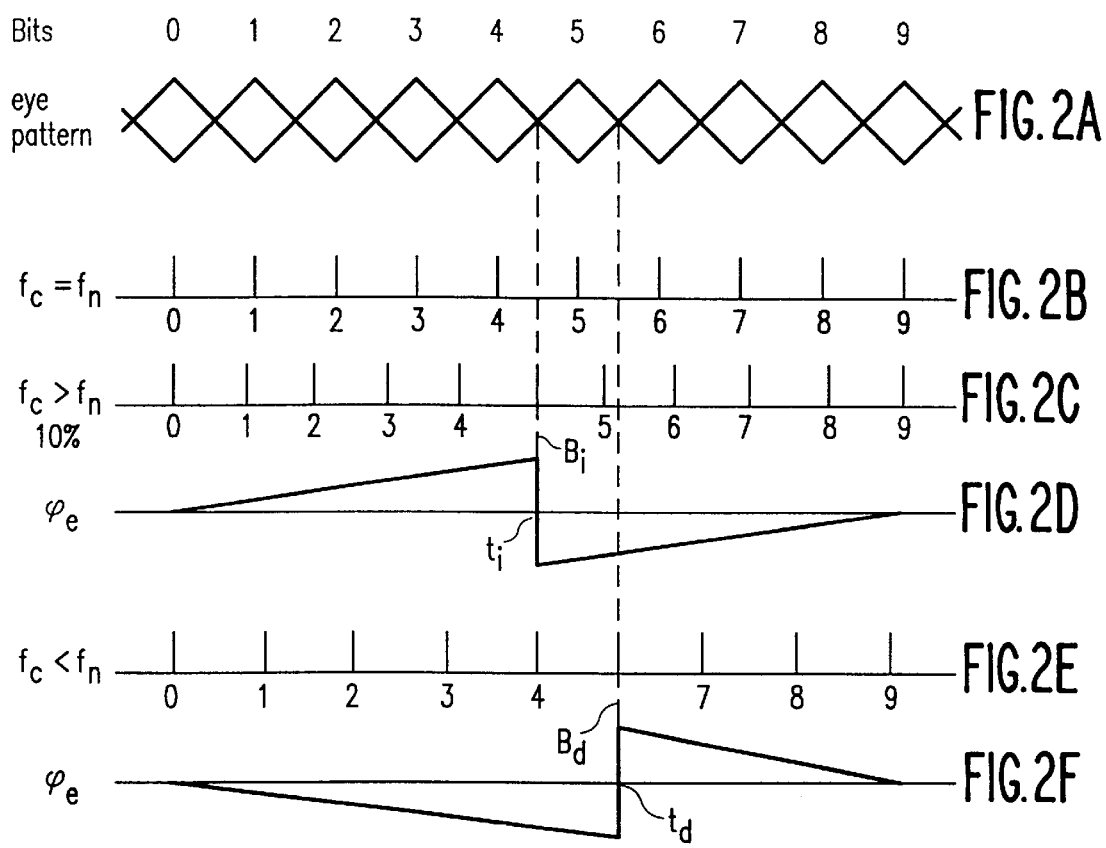

APPARATUS FOR REPRODUCING A DIGITAL INFORMATION SIGNAL FROM A RECORD CARRIER AND COUNTING THE NUMBER OF BITS BETWEEN TWO SYNC PATTERNS

The invention relates to an apparatus for reproducing a digital information signal from a record carrier, the apparatus including reading apparatus for reading a signal from a track on the record carrier;

bit detection apparatus for deriving the digital information signal from the signal read from the track in response to a clock signal and, phase locked loop apparatus for deriving the clock signal from the signal read from the track. The phase locked loop apparatus including phase comparator apparatus for deriving a phase error signal and voltage controlled oscillator apparatus for deriving the clock signal. The phase comparator apparatus has a first input for receiving the signal read from the track, a second input for receiving the clock signal and an output for supplying the phase error signal. Such an apparatus is disclosed in U.S. Pat. No. 5,488,516, document D1. Such apparatus can be used for reading a digital video signal from a record carrier, such as described in U.S. Pat. No. 5,245,483, document D3. Those skilled in the art are also directed to WO 95/29,482, document D2 for background.

For recording and subsequent reproduction of a digital information signal, an error correction encoding is carried out on the digital information signal. In document D3, this error correction encoding is in the form of a Cl or horizontal error correction encoding on blocks of information and a C2 or vertical error correction encoding. If the Cl error correction encoding is not capable of correcting an error, the C2 may be capable of doing so. The known error correction encoding sometimes fails to correct the errors that occur in the reproduced information.

The above citations are hereby incorporated in whole by reference.

SUMMARY OF THE INVENTION

The invention provides an apparatus as defined in the opening paragraph with enables an improved error correction.

The apparatus in accordance with the invention is characterized in that the apparatus further includes one or more of:

sync pattern detector apparatus for detecting sync patterns occurring in the digital information signal;

counter apparatus for counting the number of bits occurring between two sync patterns in the digital information signal;

comparator apparatus for comparing said number of bits with a predetermined value, and to generate a first control signal when the number of bits exceeds the predetermined number by at least one and being adapted to generate a second control signal when the predetermined number exceeds the number of bits by at least one; and apparatus for adding a bit to the digital information signal between the two sync patterns in response to the occurrence of the second control signal and for deleting a bit from the digital information signal between the two sync patterns in response to the occurrence of the first control signal.

The invention is based on the recognition that the Cl error correction decoding step is relatively sensitive to bitslips occurring in the reproduced information. A failure in the time-base recovery circuit of the apparatus causes one or more bits of the incoming signal to be deleted (deletions) or added (insertions). As a result of one bitslip, all the bits in a block are in error, so that the Cl error correction decoding is incapable of correcting the errors in the block.

An improvement could be obtained if bitslips could be identified. In accordance with the invention, this could be implemented by detecting the sync patterns present in the digital information signal and counting the number of bits between two sync patterns, eg. between two subsequent sync patterns occurring in the digital information signal. If the number of bits counted exceeds the expected number of bits that should be present between the two sync patterns (the predetermined number of bits defined above), this is an indication that at least one insertion has occurred, which insertion should be removed from the datastream of the digital information signal between the two sync patterns in order to maintain synchronization. If the predetermined number exceeds the number of bits counted, this is an indication that at least one deletion has occurred, which deletion should be 'filled in' into the datastream of the digital information signal between the two sync patterns in order to maintain synchronization.

More specifically, the position of the bitslip can be identified by detecting an absolute maximum in the phase error signal. Investigations have resulted in the knowledge that the phase error were already large prior to the occurrence of the bitslip and changes sign at the moment of occurrence of the bitslip. Further, in accordance with the invention, maximum value detector apparatus are provided for detecting an absolute maximum in the phase error signal, indicating the position of a bitslip. In response to the detection of an absolute maximum in the phase error signal, position information relating to the position of the bitslip can be stored, so that a correction to the digital information signal can be applied at a position substantially corresponding to the position where the bitslip occurred. Those skilled in the art will understand the invention and additional objects and advantages of the invention by studying the description of preferred embodiments below with reference to the following drawings which illustrate the features of the appended claims:

BRIEF DESCRIPTION OF THE DRAWINGS

FIG. 2 shows various signal waveforms occurring in the apparatus of FIG. 1.

FIG. 1 shows an embodiment of the apparatus including a read unit 1, having at least one read head 2 for reading a signal from a track 3 on a record carrier 4. In the present embodiment, the record carrier 4 is a magnetic record carrier, so that the read head 2 is a magnetic read head. The output of the read unit 1 is coupled to an input of an A/D converter 6. Under the influence of a clock frequency $f_b$ supplied by a clock frequency generator 8 to the A/D converter 6, the signal read from the record carrier 4 is sampled with a sampling frequency $f_b$. The sampling frequency $f_b$ is larger than, preferably one order of a magnitude larger, than the clock frequency $f_c$ to be discussed later.

Figure 1:
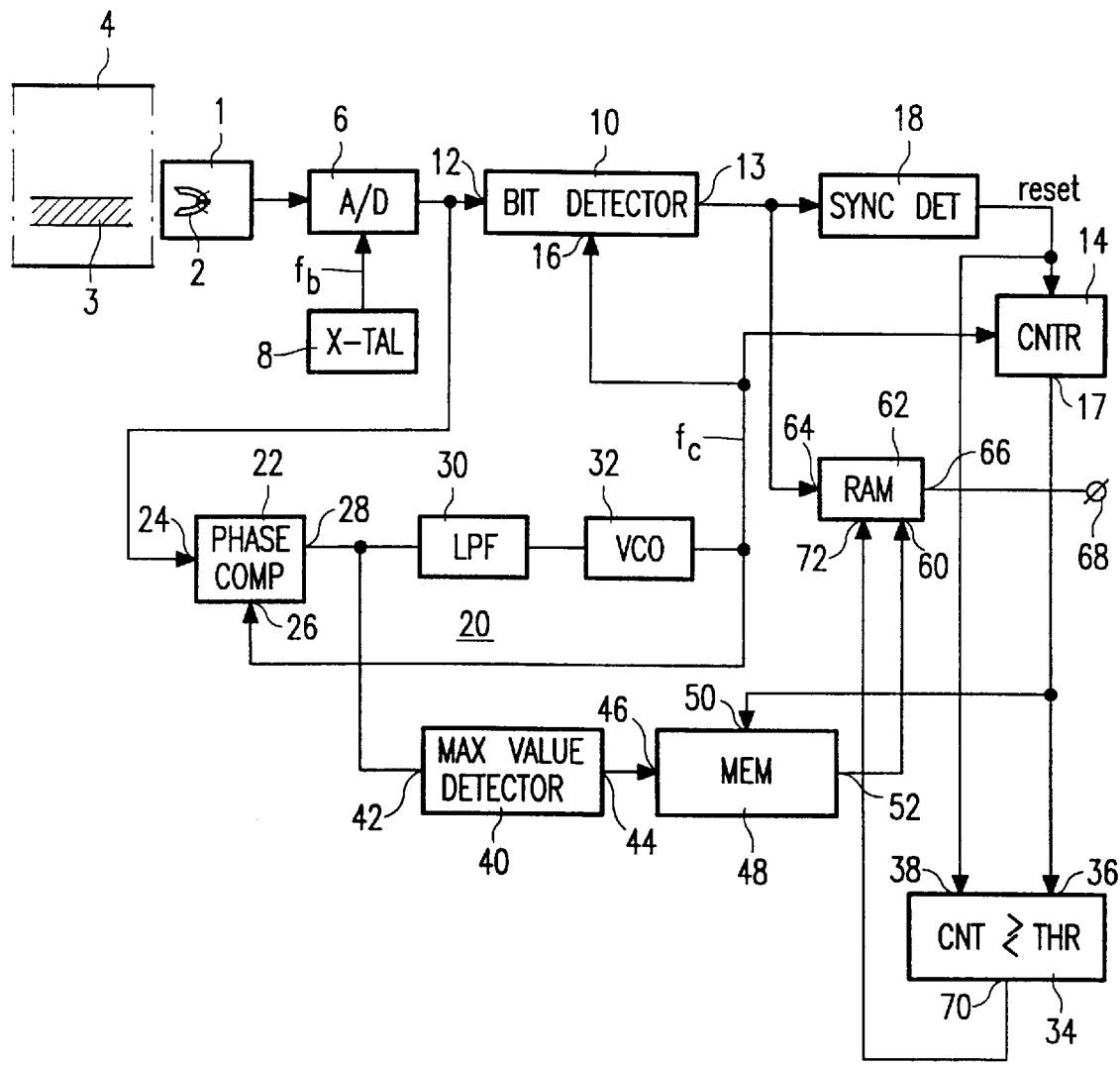
FIG. 1 shows an embodiment of the apparatus.

The signal digitized by the A/D converter may be equalized in an equalizer (not shown) and is supplied to a bit detector unit 10, which derives the digital information signal from the signal applied to its input 12 under the influence of a clock signal with a clock frequency $f_c$, applied to a clock input 16, and supplies the digital information signal to an output 13.

A phase locked loop unit 20 is available for deriving the clock signal with the clock frequency $f_c$ from the output signal of the A/D converter 6. The phase locked loop unit 20 including a phase comparator 22, having a first input 24 coupled to the output of the A/D converter 6, a second input 26 and an output 28. The output 28 of the phase comparator 22 is coupled to an input of a voltage controlled oscillator VCO 32 via a low pass filter 30. The output of the VCO 32 is coupled to the clock input 16 of the bit detector unit 10 and to the second input 26 of the phase comparator 22.

Further, a sync pattern detector unit 18 is present for detecting sync patterns present in the digital information signal supplied by the bit detector unit 10. The sync pattern detector unit 18 generates reset pulses each time it detects a sync pattern and supplies the reset pulses to a counter unit 14. The counter unit 14 counts up in response to the clock pulses $f_c$ supplied by the VCO 32. Further, a comparator 34 is present for comparing a count value, indicated CNT and supplied by the counter unit 14 to its input 36, with a predetermined threshold value, indicated THR.

A maximum value detector unit 40 is present having an input 42 coupled to the output 28 of the phase comparator unit 22. Upon detecting an absolute maximum in the signal applied to its input 42, the maximum value detector 40 generates a detection signal to its output 44. This detection signal is supplied to a load input 46 of a memory unit 48. The count value output 17 of the counter 14 is also coupled to the data input 50 of the memory 48, so that the count value of the counter unit 17 and present at the data input 50 of the memory unit 48 can be stored in the memory unit 48 in response to the control signal supplied by the detector unit 40 to the load input 46 of the memory unit 48. An output 52 of the memory unit 48 is coupled to an address input 60 of a memory unit 62, which may be in the form of a random access memory RAM. The output of the bitdetector unit 10 is further coupled to an input 64 of the memory unit 62, an output 66 of which is coupled to an output terminal 68 of the apparatus.

In response to a reset pulse generated by the detector unit 18 upon detection of a sync pattern, the counter 14 starts counting upwards, starting from zero. Upon a subsequent reset pulse, which is also supplied to an input 38 of the comparator unit 34, the count value in the counter unit 14 is stored in the comparator unit 34 and the counter unit 14 is reset to zero, and starts counting upwards again. The count value stored in the comparator 34 is a measure of the number of bits in the digital information signal and present between two sync patterns.

In a nominal situation, this number equals the predetermined value THR used in the comparator 34 for comparing the count value with. In the presence of a bitslip in the digital information signal, this number of bits is unequal to the predetermined value THR, and is larger than THR upon the occurrence of one or more insertions and is smaller than THR upon the occurrence of one or more deletions.

When the count number CNT is one larger than the predetermined value THR, the comparator 34 generates a first control signal at its output 70, and when the count value is one smaller than the predetermined value THR, the comparator 34 generates a second control signal at its output 70. The first and second control signals generated by the comparator unit 34 are supplied to a control input 72 of the memory unit 62.

The memory 62 acts as a kind of first-in-first-out register. The data sequence of bits generated by the bitdetector 10 and supplied to the input 64 are supplied with a specific delay to the output 66 of the memory 62. In response to a first control signal supplied to the input 72, which is indicative of the occurrence of an insertion, the memory 62 is capable of deleting one of the bits in the data sequence stored in the memory 62. In an equivalent way, in response to a second control signal supplied to the input 72, which is indicative of the occurrence of a deletion, the memory 62 is capable of inserting one additional bit to the data sequence stored in the memory 62. In both cases, synchronisation is restored and the error correction unit, not shown, but coupled to the output 68, is capable of carrying out an error correction on the corrected sequence.

A further explanation will be given, making use of the signals in FIG. 2.

In FIG. 2, the signals (a) and (b), describe the nominal situation for the apparatus. The signal (a) in FIG. 2 show the eye pattern that it present at the input of the bit detector unit 10. The signal (b) in FIG. 2 show the clock pulses in the clock signal applied to the clock input 16 of the bit detector unit 10, when the clock frequency $f_c$ equals the nominal clock frequency $f_n$. The bit detector unit 10 samples the eye pattern exactly in the middle of the 'eyes' so that a sequence of bits, numbered 0, 1, 2 ...., 8, 9 appear at the output 13.

Assume the clock frequency $f_c$ to be slightly larger (eg. 10 %) than $f_n$. This is shown by the signal (c) in FIG. 2. Bits occur at the output 13 of the bit detector unit 10 at the instants indicated by the clock pulses in the signal (c) in FIG. 2. Those bits are the bits numbered 0, 1, 2, 3, 4, 5, $B_i$, 5. ...., 9. As can be seen, one bit $B_i$ is added (an insertion). This bit may have the same value as the bit numbered 4, or the same value as the bit numbered 5.

Assume the clock frequency fc to be slightly lower (eg. 10 %) than $f_n$. This is shown by the signal (e) in FIG. 2. Bits occur at the output 13 of the bit detector unit 10 at the instants indicated by the clock pulses in the signal (e) in FIG. 2. Those bits are the bits numbered 0, 1, 2, 3, 4, $B_d$, 7, 8, 9. As can be seen, one bit is missing (a deletion). The bit $B_d$ may have the same value as the original bit numbered 5, or the same value as the original bit numbered 6.

It will be clear that in the situations shown by the signals (c) and (e) in FIG. 2, all bits occurring in the digital information signal after the bitslip may be in error, as they do not occur at their correct position in the data sequence between two subsequent sync patterns detected.

In accordance with the invention, the maximum value detector unit 40 detects the occurrence of a maximum in the phase error signal, such as the signals (d) and (f) in FIG. 2.

The signal (d) in FIG. 2 shows the behavior of the phase error in the situation where $f_c$ is larger (10 %) than nominal. The phase error increases in value with increasing time difference between the clock pulses in signal (c) and the maxima in the eye pattern signal, signal (a) in FIG. 2, until the time instant $t_i$. At the time instant $t_i$, which is the time instant when the insertion occurs, the phase error is maximal and rapidly changes its polarity and subsequently decreases in value as a function of time.

The signal (f) in FIG. 2 shows the behavior of the phase error in the situation where $f_c$ is smaller (10 %) than nominal. The phase error again increases in value with increasing time difference between the clock pulses in signal (e) and the maxima in the eye pattern signal, signal (a) in FIG. 2, with the difference that the polarity is the inverse of the polarity of the signal (d). The phase error increases in amplitude until the time instant $t_d$. At the time instant $t_d$, which is the time instant when the deletion occurs, the phase error is again maximal (in negative direction) and rapidly changes its polarity and subsequently decreases in value as a function of time.

The maximum value detector unit 40 is adapted to generate a control signal upon detection of the maxima in the phase error signal, that is at the time instant $t_i$ in signal (d) and at the time instant $t_d$ in signal (f) in FIG. 2. Upon receipt of the control signal, the memory unit 48 is adapted to store the count value present at its input 50. This count value is the value 5, for both the situations of the signals (d) and (f) in FIG. 2, assuming that a reset signal was generated by the sync pattern detector 18 at the time instant of occurrence of the bit numbered 0 in FIG. 2.

In the situation of the signal (d) in FIG. 2, the effective count value in the counter 14 at the instant of receiving the next reset pulse, will be at least one higher than the predetermined value THR. In response to the control signal applied by the comparator unit 34 to the input 72 of the memory unit 62, this will supply one bit less at its output 66. The deletion of this bit will take place at the position of the bit $B_i$ (numbered 5) in accordance with the count value stored in the memory 48 and supplied to the input 60 of the memory 62. This can be realized by skipping the address where the bit numbered $B_i$ is stored in the memory 62, during read out of the memory 62.

In the situation of the signal (f) in FIG. 2, the effective count value in the counter 14 at the instant of receiving the next reset pulse, will be at least one lower than the predetermined value THR. In response to the control signal applied by the comparator unit 34 to the input 72 of the memory unit 62, this will supply one bit more at its output 66. The adding of this bit will take place at the position of the bit $B_d$ (numbered 5) in accordance with the count value stored in the memory 48 and supplied to the input 60 of the memory 62. This can be realized by twice reading out the bit $B_d$ from the memory 62.

It will be apparent that, in situations where two bitslips occurred between two detections of a sync pattern, such as two insertions, the count value supplied to the comparator 34 will be two higher than the value THR. Further, the maximum value detector 40 will have detected two maxima so that two values are stored in the memory 48. In response thereto, two bits will be deleted from the datastream stored in the memory 62, more specifically, those two bits occurring the closest to the moments of detecting the maxima in the phase error signal.

An equivalent reasoning can be thought of in a situation when two or more deletions occurred between the detection of two sync patterns.

As said earlier, the bit sequence thus corrected for bitslips is supplied to the output terminal 68 and can be supplied to an error correction unit (not shown) for carrying out an error correction on the bit sequence. This error correction can be the C1 and C2 error correction in response to the C1 and C2 error correction encoding described in the introductory part of the description.

Whilst the invention has been described with respect to preferred embodiments thereof, it is to be understood that these are not limitative examples. Thus, various modifications and other embodiments may become apparent to those skilled in the art, without departing from the scope of the invention, as defined in the claims. As an example, the invention has been described with reference to an apparatus for reading information from a magnetic record carrier. It will be clear to the skilled man that the invention is equally well applicable to an apparatus for reading information from an optical record carrier. Further, it should be noted that the sync pattern detector 18 need not necessarily detect the number of bits occurring between two directly succeeding sync patterns in the digital information signal. One could detect each second sync pattern and count the number of bits between each time two subsequent even numbered sync patterns.

Further, the invention lies in each and every novel feature or combination of features as herein disclosed.

I claim:

1. Apparatus for reproducing a digital information signal comprising:

means for reading a signal from a track on a record carrier;

bit detection means for deriving a digital information signal from the signal read from the track in response to a clock signal;

phase locked loop means for deriving the clock signal from the signal read from the track, including phase comparator means for deriving a phase error signal and voltage controlled oscillator means for deriving the clock signal, the phase comparator means having a first input for receiving the signal read from the track, a second input for receiving the clock signal and an output for supplying the phase error signal;

means for detecting sync patterns occurring in the digital information signal, means for counting the number of bits occurring between two sync patterns in the digital information signal, means for comparing the number of bits with a predetermined value, to generate a first control signal when the number of bits exceeds the predetermined number by at least one and to generate a second control signal when the predetermined number exceeds the number of bits by at least one;

means for adding a bit to the digital information signal between the two sync patterns in response to the occurrence of the second control signal and for deleting a bit from the digital information signal between the two sync patterns in response to the occurrence of the first control signal.

2. The apparatus of claim 1, further comprising:

means for detecting an absolute maximum value in the phase error signal and for generating a third control signal in response thereto;

memory means for storing position information relating to a position in the digital information signal between the two sync patterns where the absolute maximum in the phase error signal occurred, in response to the third control signal.

3. The apparatus of claim 2, in which the means for adding a bit are adapted to add a bit to the digital information signal substantially at the position in the digital information signal between said two sync patterns where the absolute maximum in the phase error signal occurred; and the means for deleting a bit are adapted to delete a bit from the digital information signal substantially at the position in the digital information signal between said two sync patterns where the absolute maximum in the phase error signal occurred.

4. Apparatus of claim 1, in which the means for adding a bit are adapted to add a bit to the digital information signal with a bit value identical to the bit in the digital information signal present just before the position in the digital information signal where the absolute maximum in the phase error signal occurred.

5. The apparatus of claim 1, in which:

the apparatus further comprises means for detecting an absolute maximum value in the phase error signal and for generating a third control signal in response thereto;

the apparatus further comprises memory means for storing position information relating to a position in the digital information signal between the two sync patterns where the absolute maximum in the phase error signal occurred, in response to the third control signal;

the means for adding a bit are for adding a bit to the digital information signal substantially at the position in the digital information signal between the two sync patterns where the absolute maximum in the phase error signal occurred;

the means for deleting a bit are for deleting a bit from the digital information signal substantially at the position in the digital information signal between the two sync patterns where the absolute maximum in the phase error signal occurred; and the means for adding a bit are for adding a bit to the digital information signal with a bit value identical to the bit in the digital information signal present just before the position in the digital information signal where the absolute maximum in the phase error signal occurred.

\* \* \* \* \*